(12) United States Patent
Lin et al.

(10) Patent No.: US 7,573,926 B2
(45) Date of Patent: Aug. 11, 2009

(54) MULTIWAVELENGTH QUANTUM DOT LASER ELEMENT

(75) Inventors: Kuo-Jui Lin, Hsinchu (TW); Kun-Fong Lin, Hsinchu (TW); Chih-Ming Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 109 days.

(21) Appl. No.: 11/798,864

(22) Filed: May 17, 2007

(65) Prior Publication Data

US 2008/0165819 A1    Jul. 10, 2008

(30) Foreign Application Priority Data

Jan. 10, 2007  (TW) .............................. 96100995 A

(51) Int. Cl.
*H01S 3/00* (2006.01)
*H01S 5/00* (2006.01)
(52) U.S. Cl. ................................. 372/44.01; 372/38.02
(58) Field of Classification Search .............. 372/38.02, 372/38.07, 44.01
See application file for complete search history.

(56) References Cited

U.S. PATENT DOCUMENTS

2008/0151950 A1* 6/2008 Lin et al. ................. 372/23

FOREIGN PATENT DOCUMENTS

| JP | 63213384 | 9/1988 |
|---|---|---|
| JP | 10112567 | 4/1998 |
| JP | 2000340883 | 12/2000 |

* cited by examiner

*Primary Examiner*—Armando Rodriguez
(74) *Attorney, Agent, or Firm*—Rabin & Berdo, P.C.

(57) ABSTRACT

A multiwavelength quantum dot laser element is provided. A perpendicular stack of quantum dot active regions with different light emitting wavelengths is employed, and thickness, material composition, and quantum dot size of each of the quantum dot active regions are modulated, so as to form various laser oscillation conditions. When a current applied to the quantum dot laser element is larger than the start-oscillation current condition, lasers with different wavelengths are simultaneously obtained in each of the quantum dot active regions, thereby achieving the application of the multiwavelength quantum dot laser element.

14 Claims, 4 Drawing Sheets

MULTIWAVELENGTH QUANTUM DOT LASER ELEMENT

CROSS-REFERENCE TO RELATED APPLICATIONS

This non-provisional application claims priority under 35 U.S.C. § 119(a) on Patent Application No(s). 096100995 filed in Taiwan, R.O.C. on Jan. 10, 2007, the entire contents of which are hereby incorporated by reference.

BACKGROUND OF THE INVENTION

1. Field of Invention

The present invention relates to a semiconductor laser element. More particularly, the present invention relates to a multiwavelength quantum dot laser element capable of simultaneously emitting lasers of various different wavelengths under the condition that an applied current is larger than a start-oscillation current.

2. Related Art

Recently, it is found in many researches that laser elements using quantum dot structure as light emitting region are characterized in having high quantum efficiency and low start-oscillation current, etc., such that the quantum dot semiconductor laser has developing potentials in industrial applications, such as fiber communication or optical data storage.

The conventional method of fabricating the quantum dot mainly adopts molecular beam epitaxy (MBE) or metalorganic chemical vapor deposition (MOCVD) and uses a self-assembly method to make the quantum dot self-assembled on a specific substrate surface. Recently, the self-assembled quantum dot can be applied in semiconductor amplifiers, superluminescent diodes, tunable wavelength semiconductor lasers, and multiwavelength semiconductor lasers, and so on.

For the application of the conventional multiwavelength semiconductor laser, for example, in Japanese Published Patent No. 2000340883, the material gain provided by more than three different quantum dot sizes in each of the quantum dot layers is utilized, and a super structure grating structure is used to control the laser gain with wavelength selectivity, in which each quantum dot can be grown by Stranski-Kranstanov (SK) or atomic layer epitaxy (ALE).

In addition, in Japanese Patents Publication No. 10112567 and No. 63213384, different quantum dot sizes are adjusted to generate multiwavelength lasing effect. As for the former, mainly, openings with different sizes are etched in the same layer or different layer structures, and quantum dot structures with various sizes are grown on the openings. As for the latter, quantum dot structures with various sizes are grown in different regions on an InP substrate, and current is injected by individual electrodes to obtain the simultaneous emitting of the multiwavelength laser.

However, as the growing condition of each of the quantum dot layers is the same, and each of the quantum dot layers grows the quantum dot structure through self-assembly, the difference of the quantum dot sizes is limited. In addition, the above-mentioned laser element structure further has worries in high start-oscillation current, high operating current, and poor stability, etc., so it is necessary to provide a multiwavelength semiconductor laser element capable of providing high stability, low start-oscillation current, and low operating current.

SUMMARY OF THE INVENTION

In view of the above problems, the present invention provides a multiwavelength quantum dot laser. A perpendicular stack of quantum dot active regions with different light emitting wavelengths is employed, and the thickness, the material composition, and the quantum dot size of each of the quantum dot active regions are modulated, so as to form various laser oscillation conditions, such that the multiwavelength quantum dot laser element of the present invention can emit laser light in the quantum dot active regions with different wavelengths simultaneously.

The multiwavelength quantum dot laser provided by the present invention includes a first semiconductor layer, a second semiconductor layer, and an active region. The active region is disposed between the first semiconductor layer and the second semiconductor layer, so as to form a sandwiching layer structure including a plurality of quantum dot active regions, and each of the quantum dot active regions includes a plurality of quantum dot layers with a corresponding number of covering layers. The parameter conditions of the quantum dot layer and/or the covering layer in each of the quantum dot active regions, such as the thickness, the material composition, and the quantum dot size, are changed to modulate each of the quantum dot active regions to emit laser light with different wavelengths.

In the multiwavelength quantum dot laser element provided by the present invention, the stacking structure of quantum dot active regions capable of emitting lasers of different wavelengths is utilized to satisfy laser emitting conditions of different wave bands. Moreover, the stacking sequence, the thickness, and the material composition of the quantum dot layer or the covering layer in the quantum dot active regions are modulated to distinctly distinguish the quantum dot active regions with different light-emitting wavelengths. Therefore, the application of the multiwavelength quantum dot laser element is achieved, under the precondition of avoiding the difficulty of distinguishing the multiwavelength, and avoiding high start-oscillation current and high operating current in the prior art.

The features and practice of the preferred embodiments of the present invention will be illustrated in detail below with the accompanying drawings. Those skilled in the arts can easily understand and implement the content of the present invention. Furthermore, the relative objectives and advantages of the present invention are apparent to those skilled in the arts with reference to the content disclosed in the specification, claims, and drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

The objectives, structures, features, and functions of the present invention will be illustrated in detail below accompanied with the embodiments. The above description of the content of the present invention and the following illustration of the embodiments are intended to demonstrate and explain the principle of the present invention and to provide further explanations of the claims of the present invention.

Figure 1:
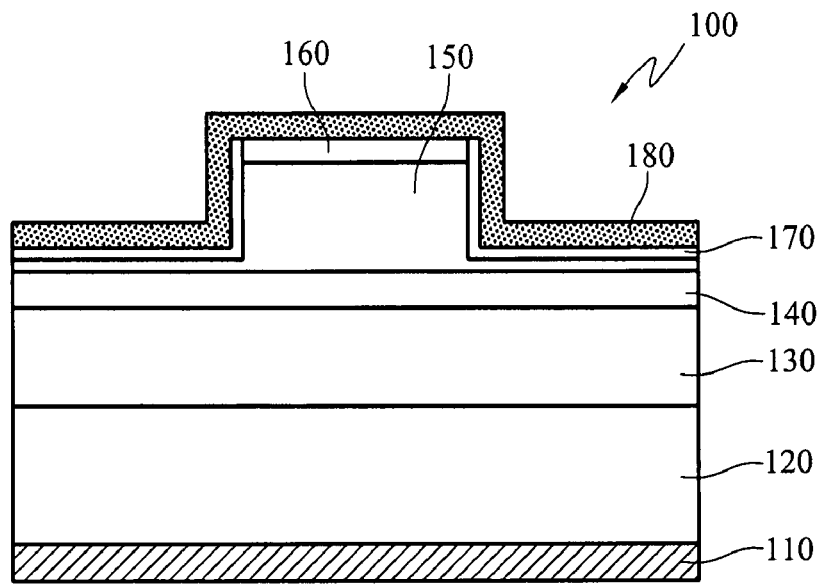
FIG. 1 is a sectional view of a multiwavelength quantum dot laser element according to the present invention.

Referring to FIG. 1, it is a sectional view of a multiwavelength quantum dot laser of the present invention. As shown in FIG. 1, the multiwavelength quantum dot laser element 100 includes a first electrode 110, a substrate 120, a first cladding layer 130, an active region 140, a second cladding layer 150, a contact layer 160, an insulation layer 170, and a second electrode 180.

The substrate 120 used for supporting is generally formed by a semiconductor material, for example, GaAs substrate or InP substrate (n-type or p-type conductive ions with a specific concentration are doped according to the configuration of the electric filed).

The first cladding layer 130, the active region 140, and the second cladding layer 150 are sequentially stacked on the substrate 120. The first cladding layer 130 and the second cladding layer 150 have different conductive types, that is, one has the p-type conductive type, and the other has the n-type conductive type, and are mainly used to provide the source of electrons and holes required for generating a PN junction at the active region 140. The first cladding layer 130 and the second cladding layer 150 are usually formed by a material with high energy gap, so as to generate a barrier of charge carriers, for preventing the electrons or holes escaping from the active region to lower down the quantum efficiency. The commonly selected material includes semiconductor materials, such as AlGaAs and AlInGaP. According to the configuration of the electric field, n-type or p-type conductive ions with different concentrations are doped, so as to reduce the contact resistance. Moreover, the first cladding layer 130 and the second cladding layer 150 may be grown by MBE or MOCVD. In addition, the second cladding layer 150 forms a ridge stripe waveguide structure having a light confinement effect of limiting the light generated by the active region 140 in the horizontal direction in the active region 140, so as to maintain the stability of the lateral (horizontal) optical mode. However, the multiwavelength quantum dot laser of the present invention is not limited to the laser application of the aforementioned ridge stripe waveguide structure, but can also be applied in other conventional waveguide structures, such as gain-guided, weakly index-guided laser, and strongly index guided structures. The conventional waveguide structures are commonly adopted waveguide techniques, so the details will not be described herein again.

The contact layer 160 on the ridge stripe waveguide is used to reduce the contact resistance between the second electrode 180 and the second cladding layer 150, so as to achieve the preferred ohmic contact. The common material of the contact layer 160 is semiconductor materials, such as GaAs, InGaAs, GaN or InGaN.

The insulation layer 170 is formed on the second cladding layer 150 except for the top of the ridge stripe waveguide, for defining an electrode contact region, so as to make the current injected into the active region 140 concentrated, and to increase the charge density of the unit volume. In addition, a partially effective refraction index waveguide effect is provided at the same time, so as to increase the opportunity of generating laser oscillation. Generally, the material of the insulation layer 170 includes dielectric materials, such as $SiO_2$ or $Si_3N_4$.

The first electrode 110 and the second electrode 180 are respectively formed on the bottom of the substrate 120 and on the contact layer 160, and are respectively used as a cathode for injecting electrons and an anode for injecting holes, such that the electrons and holes form electron hole pairs in the active region 140 to emit photons. The common cathode materials are metal materials, such as Ni, Au, or composite materials like AuGe/Ni/Au, and the anode materials are metal materials, such as Au, Ti, or composite materials like Ti/Pt/Au.

Figure 2:
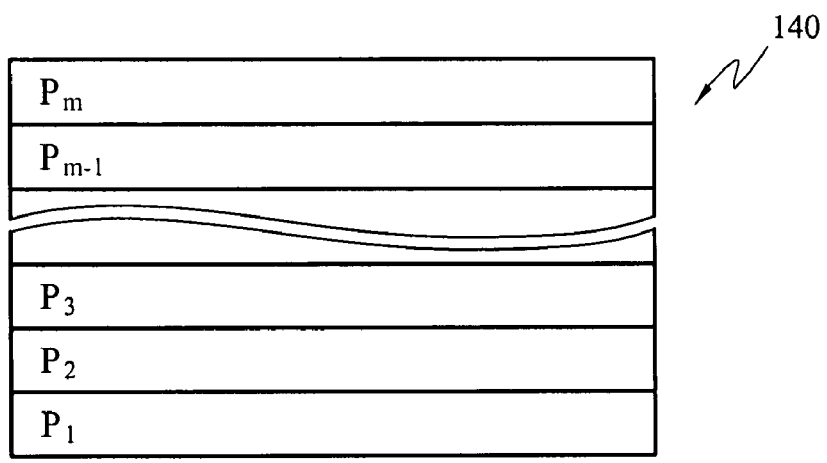
FIG. 2 is a sectional view of an active region of the multiwavelength quantum dot laser element according to the present invention.

The structural composition of the active region 140 is described in detail below by a sectional view of the multiwavelength quantum dot laser according to the present invention as shown in FIG. 2.

Figure 3:
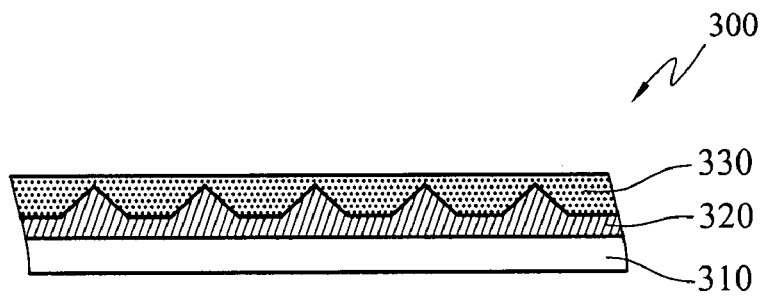
FIG. 3 is a schematic view of a periodic structural unit in the active region of the multiwavelength quantum dot laser element according to the present invention.

As shown in FIG. 2, the active region 140 includes m perpendicularly stacked quantum dot active regions $P_1$ to $P_m$, and the wavelength of the laser generated by each of the quantum dot active regions $P_1$ to $P_m$ is mutually different. In addition, in a sectional view of the quantum dot active regions $P_1$ to $P_m$ as shown in FIG. 3, each of the quantum dot active regions $P_1$ to $P_m$ is stacked by a plurality of periodic structural units through an epitaxy method, such as MBE or MOCVD. The periodic structural unit 300 sequentially includes a spacing layer 310, a quantum dot layer 320 formed on the spacing layer 310, and a covering layer 330 formed on the quantum dot layer 320. The quantum dot layer 320 includes many quantum dot structures. Due to the quasi-zero-dimensional nanometer structure of the quantum dot, the electrons and holes are easily captured in the quantum dot structure and are recombined to generate photons to show a distinct luminescence phenomenon. Further, the quantum dot structure is formed through the mismatch of the lattice constants between heterogeneous materials of the quantum dot layer 320 and the spacing layer 310 below formed by different materials, so as to result in the accumulation of the strain, and to form quasi-zero-dimensional self-assembled quantum dots through the release of the strain, i.e., the so-called S-K growth mode. The material suitable for the quantum dot layer 320 includes semiconductor materials, such as InAs, $In_xGa_{1-x}As$, $In_xGa_{1-x}AsN$, $In_xGa_{1-x}AsSb$, $In_xGa_{1-x}AsNSb$, $In_xN$, $In_xGa_{1-x}N$, and $In_xGa_zAl_{1-x-z}N$, and $0<x<1$, $0<z<1$. In addition, the quantum dot layer 320 may also form the quantum dot structure by alternate deposition of submonolayer InAs and GaAs materials or InN and GaN materials through atomic layer epitaxy (ALE). The material suitable for forming the covering layer 330 includes semiconductor materials, such as $In_yGa_{1-y}As$, $In_yGa_{1-y}N$, and $In_yGa_zAl_{1-y-z}N$, and $0<y<1$, $0<z<1$. Moreover, the content ratio of In in the material of the quantum dot layer 320 is larger than that of the quantum dot covering layer 330, i.e., x>y. By changing the thickness, the material composition, and the quantum dot size of the quantum dot layer 320, and changing the thickness or the material composition of the covering layer 330, the wavelength of the laser emitted by each of the quantum dot active regions $P_1$ to $P_m$ can be modulated. In addition, the forming of the spacing layer 310 can be used to generate a carrier confinement effect, for preventing carriers escaping from the quantum dot layer 320. Usually, the spacing layer 310 is made of a binary compound semiconductor material, such as GaAs or GaN.

Furthermore, mirrors provided for reflecting light are disposed on the front and rear end faces of the multiwavelength quantum dot laser element 100, and the reflecting mirrors may be formed by the natural splitting or dry etching of the crystal.

When a forward bias voltage is applied to a first electrode 110 and a second electrode 180 at two ends of the multiwavelength quantum dot laser element 100, the holes and electrons in the second cladding layer 150 and the first cladding layer 130 are driven to be injected into the active region 140. Thereafter, the holes and electrons in the active region 140 form electron hole pairs through a recombination reaction, and are then released by photons. If the bias voltage is continuously increased till the value of the applied current exceeds the specific current, a population inversion phenomenon is generated, the induced release of the photon starts, and oscillation is performed between the two mirrors of the multiwavelength quantum dot laser element 100 to emit a laser. When an optical mode gain ($g_{th}$) resulted from the bias voltage applied to the multiwavelength quantum dot laser element 100 is enough to compensate the internal loss ($\alpha_i$) caused as the light travels in the multiwavelength quantum dot laser element 100 and the mirror loss ($\alpha_m$) caused as the light is reflected by the mirror and leaves the multiwavelength quantum dot laser element 100, the resonance condition is achieved to generate a laser, i.e., the light gain ($g_{th}$) must satisfy the following formula:

$$g_{th} = \alpha_i + \alpha_m = \alpha_i + \frac{1}{2L}\ln\left(\frac{1}{R_1 R_2}\right)$$

L is the length of the multiwavelength quantum dot laser, and R1 and R2 are respectively the reflectivities of the front end mirror and the rear end mirror. Therefore, the length of the multiwavelength quantum dot laser element 100 is adjusted, such that when the multiwavelength quantum dot laser element 100 satisfies the above laser generating condition in different quantum dot active regions $P_1$ to $P_m$, lasers with different wavelengths are generated simultaneously, so as to achieve a laser element capable of simultaneously emitting lasers of different wavelengths. The laser element can be applied to fiber communication or pickup head of an optical disc drive.

Figure 4:
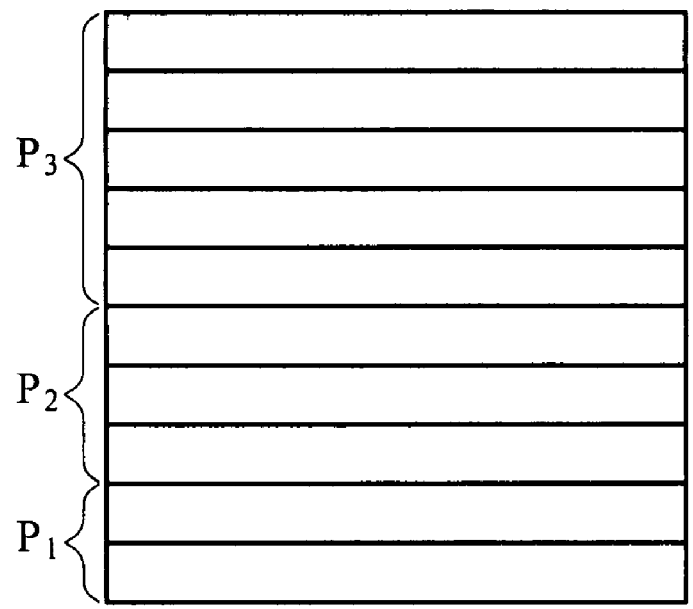
FIG. 4 is a schematic view of the stacking aspect of quantum dot active regions with descending wavelengths of the multiwavelength quantum dot laser element according to the present invention.
Figure 5:
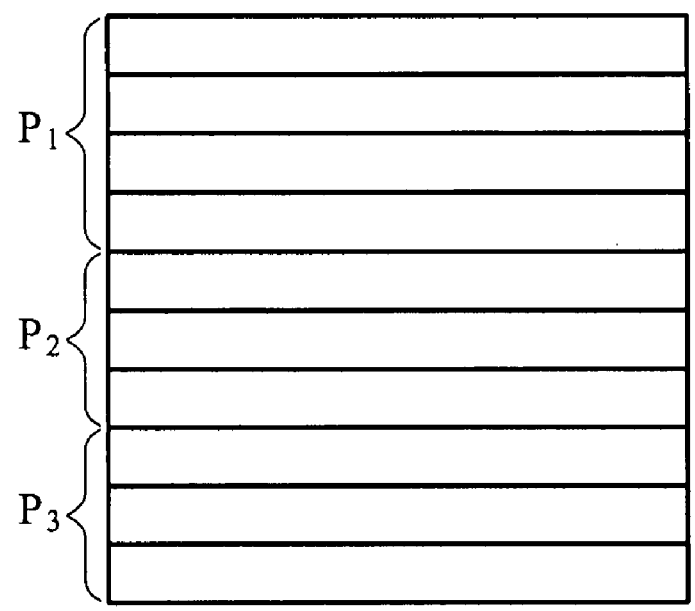
FIG. 5 is a schematic view of the stacking aspect of quantum dot active regions with ascending wavelengths of the multiwavelength quantum dot laser element according to the present invention.
Figure 6:
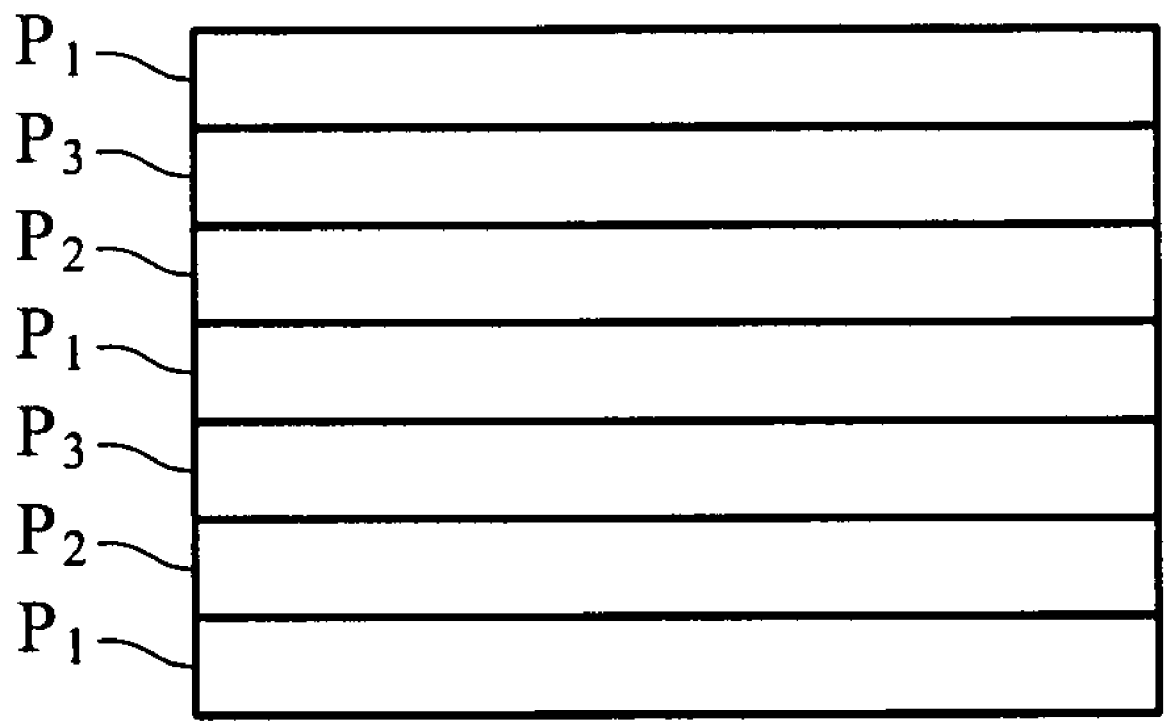
FIG. 6 is a schematic view of the stacking aspect of quantum dot active regions with interlaced wavelengths of the multiwavelength quantum dot laser element according to the present invention.

Referring to FIGS. 4 to 6, the stacking aspect of each of the quantum dot active regions in the active region is shown.

FIG. 4 shows the stacking aspect of quantum dot active regions with descending wavelengths. The wavelength of the laser emitted by each of the quantum dot active regions $P_1$ to $P_3$ descends in the direction away from the first cladding layer 130, and the relation of the wavelength of the laser emitted by each of the quantum dot active regions $P_1$ to $P_3$ is $P_1>P_2>P_3$. In addition, each of the quantum dot active regions $P_1$ to $P_3$ includes a plurality of periodic structural units 300. For example, the quantum dot active region $P_1$ is formed by two groups of periodic structural units 300, the quantum dot active region $P_2$ is formed by three groups of periodic structural units 300, and the quantum dot active region $P_3$ is formed by five groups of periodic structural units 300. However, different laser wavelengths are formed as the quantum dot layer 320 and/or the covering layer 330 in each of the quantum dot active regions $P_1$ to $P_3$ have different parameter conditions, including the thickness, the material composition, and the quantum dot size. The wavelength of the laser emitted by each of the quantum dot active regions $P_1$ to $P_3$ is modulated according to different parameter conditions. In an embodiment, the quantum dot layer 320 of each of the quantum dot active regions $P_1$ to $P_3$ has the same parameter condition, and the covering layer 330 of each of the quantum dot active regions $P_1$ to $P_3$ is formed by different parameter conditions. On the contrary, in another embodiment, the quantum dot layer 320 of each of the quantum dot active regions $P_1$ to $P_3$ has different parameter conditions, and the covering layer 330 of each of the quantum dot active regions $P_1$ to $P_3$ has the same parameter condition. Certainly, the quantum dot layer 320 and the covering layer 330 of each of the quantum dot active regions $P_1$ to $P_3$ may also have different parameter conditions at the same time.

FIG. 5 shows the stacking aspect of quantum dot active regions with ascending wavelengths. The wavelength of the laser emitted by each of the quantum dot active regions $P_1$ to $P_3$ ascends in the direction away from the first cladding layer 130, and the relation of the wavelength of the laser emitted by each of the quantum dot active regions $P_1$ to $P_3$ is $P_1>P_2>P_3$. In addition, each of the quantum dot active regions $P_1$ to $P_3$ includes a plurality of periodic structural units 300. For example, the quantum dot active region $P_1$ is formed by four groups of periodic structural units 300, the quantum dot active region $P_2$ is formed by three groups of periodic structural units 300, and the quantum dot active region $P_3$ is formed by three groups of periodic structural units 300. Further, the aforementioned different laser wavelengths are formed as the quantum dot layer 320 and/or the covering layer 330 in each of the quantum dot active regions $P_1$ to $P_3$ have different parameter conditions, including the thickness, the material composition, and the quantum dot size. The wavelength of the laser emitted by each of the quantum dot active regions $P_1$ to $P_3$ is modulated according to different parameter conditions. In an embodiment, the quantum dot layer 320 of each of the quantum dot active regions $P_1$ to $P_3$ has the same parameter condition, and the covering layer 330 of each of the quantum dot active regions $P_1$ to $P_3$ is formed by different parameter conditions. On the contrary, in another embodiment, the quantum dot layer 320 of each of the quantum dot active regions $P_1$ to $P_3$ has different parameter conditions, and the covering layer 330 of each of the quantum dot active regions $P_1$ to $P_3$ has the same parameter condition. Certainly, the quantum dot layer 320 and the covering layer 330 of each of the quantum dot active regions $P_1$ to $P_3$ may also have different parameter conditions at the same time.

FIG. 6 shows the stacking aspect of quantum dot active regions with interlaced wavelengths. The relation of the wavelength of the laser emitted by each of the quantum dot active regions $P_1$ to $P_3$ is $P_1>P_2>P_3$, and the quantum dot active regions $P_1$ to $P_3$ are perpendicularly arranged in an interlaced manner. Each of the quantum dot active regions $P_1$ to $P_3$ includes a periodic structural unit 300, for example, the quantum dot active regions $P_1$, $P_2$, and $P_3$ are sequentially formed on the first cladding layer 130, and the relation of the wavelength of the laser emitted by each of the quantum dot active regions $P_1$ to $P_3$ is $P_1 > P_2 > P_3$. The aforementioned different laser wavelengths are formed as the quantum dot layer 320 and/or the covering layer 330 in each of the quantum dot active regions $P_1$ to $P_3$ have different parameter conditions, including the thickness, the material composition, and the quantum dot size. The wavelength of the laser emitted by each of the quantum dot active regions $P_1$ to $P_3$ is modulated according to different parameter conditions. In an embodiment, the quantum dot layer 320 of each of the quantum dot active regions $P_1$ to $P_3$ has the same parameter condition, and the covering layer 330 of each of the quantum dot active regions $P_1$ to $P_3$ is formed by different parameter conditions. On the contrary, in another embodiment, the quantum dot layer 320 of each of the quantum dot active regions $P_1$ to $P_3$ has different parameter conditions, and the covering layer 330 of each of the quantum dot active regions $P_1$ to $P_3$ has the same parameter condition. Certainly, the quantum dot layer 320 and the covering layer 330 of each of the quantum dot active regions $P_1$ to $P_3$ may also have different parameter conditions at the same time.

The multiwavelength quantum dot laser element with a descending stacking aspect of the quantum dot active regions as shown in FIG. 4 is utilized, and different resonant cavity lengths are intercepted for performing an electroluminescent spectrum test. The periodic structural unit contained in each of the quantum dot active regions $P_1$ to $P_3$ is a spacing layer form by GaAs material, a quantum dot layer formed by InAs material, or a covering layer formed by $In_{0.15}Ga_{0.85}As$. The thickness of the $In_{0.15}Ga_{0.85}As$ covering layer contained in each of the quantum dot active regions $P_1$ to $P_3$ is mutually different, thus forming the quantum dot active region $P_1$ capable of generating the wavelength $\lambda_1$, the quantum dot active region $P_2$ capable of generating the wavelength $\lambda_2$, and quantum dot active region $P_3$ capable of generating the wavelength $\lambda_3$, and $\lambda_1 > \lambda_2 > \lambda_3$.

Figure 7:
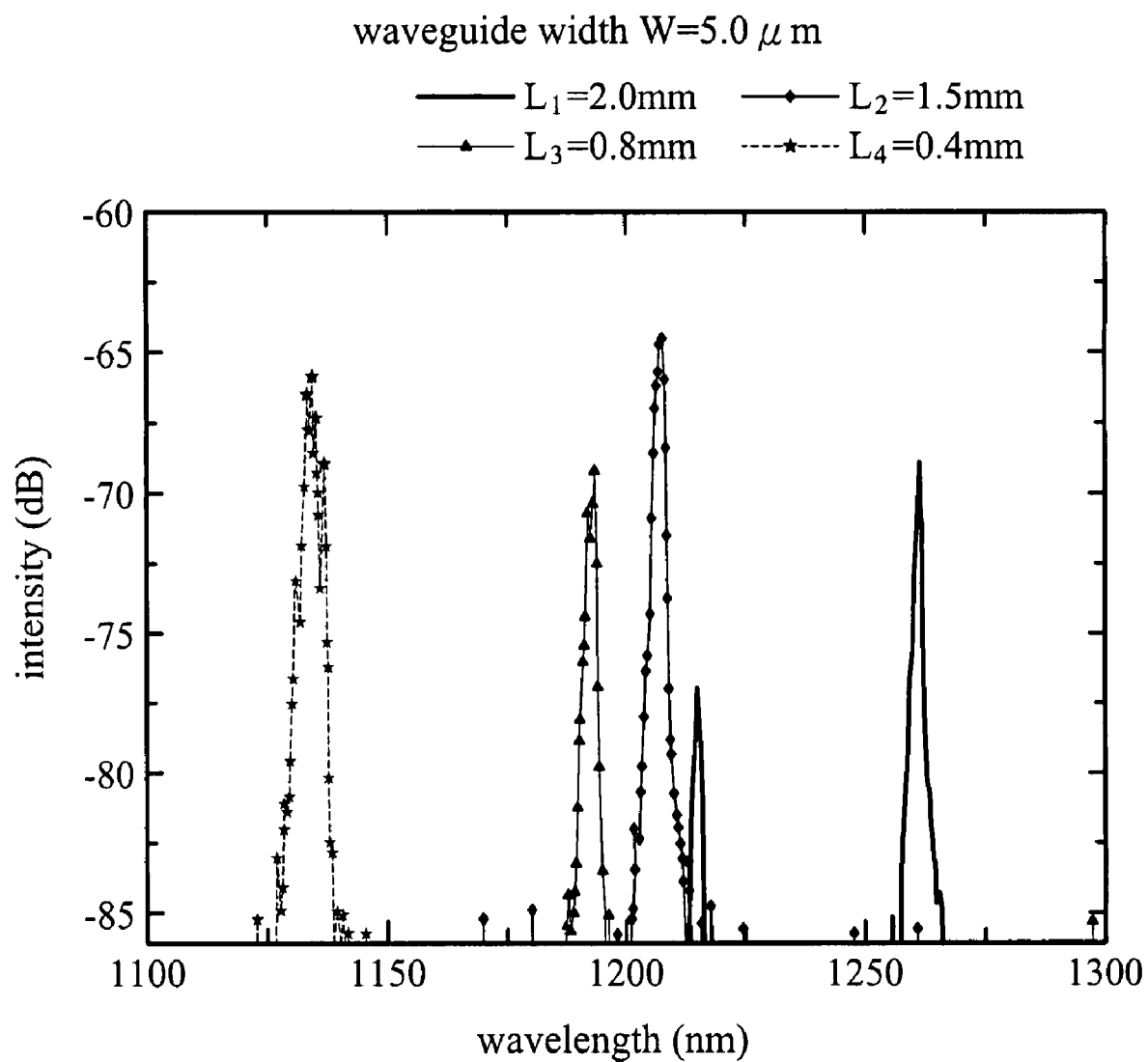
FIG. 7 is a relation diagram of luminous intensity to wavelength of the multiwavelength quantum dot laser element with a descending stacking aspect of the quantum dot active regions.

Referring to FIG. 7, a relation diagram of luminous intensity to wavelength of the multiwavelength quantum dot laser element with a descending stacking aspect of the quantum dot active regions is shown. In FIG. 7, under the condition that the operating current is 30 mA/cm², for multiwavelength quantum dot laser elements with different resonant cavity lengths of 0.4 mm, 0.8 mm, 1.5 mm, and 2.0 mm and with a waveguide width of 5 µm, the multiwavelength quantum dot laser element with the resonant cavity length of 2.0 mm may simultaneously emit laser light with different wavelength bands of 1215 nm and 1263 nm which are due to different quantum dot active regions.

In the present invention, the stacking structure of the quantum dot active regions with different light emitting wavelengths is used together with changes in the thickness, the material composition, and the quantum dot size of the quantum dot layer or the covering layer, so as to have different wavelength regions in the same quantum dot laser element. When the applied current is sufficient to generate the light gain threshold required by laser oscillation in different quantum dot active regions with a specific resonant cavity length, the lasers with different wavelengths are emitted from different quantum dot active regions. In addition, in the multiwavelength quantum dot laser element of the present invention, the composition condition of the quantum dot layer or the covering layer is modulated, so as to distinctly distinguish the quantum dot active regions with different light emitting wavelength bands, and to reduce the start-oscillation current and the operating current. Therefore, the requirement of the stable operation of the multiwavelength quantum dot laser element is satisfied.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A multiwavelength quantum dot laser element, comprising:
   a first semiconductor layer;
   a second semiconductor layer; and
   an active region, disposed between the first semiconductor layer and the second semiconductor layer, having a plurality of quantum dot active regions, each of the quantum dot active regions comprising a quantum dot layer and a covering layer that covers the quantum dot layer,
   wherein when an applied current is larger than a start-oscillation current, the quantum dot active regions simultaneously generate a plurality of laser lights with different wavelengths,
   wherein at least one different parameter condition exist between the quantum dot active regions,
   wherein the parameter condition comprises one of thickness, material composition, and quantum dot size of the quantum dot layers, and any combination thereof, and
   wherein the parameter condition further comprises one of thickness of the covering layers, material composition of the covering layers, and a combination thereof.

2. The multiwavelength quantum dot laser element as claimed in claim 1, wherein each of the quantum dot layers comprises a plurality of quantum dots.

3. The multiwavelength quantum dot laser element as claimed in claim 1, wherein each of the quantum dot layers is formed by a Stranski-Kranstanov growth mode.

4. The multiwavelength quantum dot laser element as claimed in claim 2, wherein the quantum dots are formed by InAs and GaAs materials through an atomic layer epitaxy process.

5. The multiwavelength quantum dot laser element as claimed in claim 2, wherein the quantum dots are formed by InN and GaN materials through an atomic layer epitaxy process.

6. The multiwavelength quantum dot laser element as claimed in claim 1, wherein the quantum dot layers are formed from a semiconductor material.

7. The multiwavelength quantum dot laser element as claimed in claim 6, wherein the semiconductor material is selected from a material group consisting of InAs, $In_xGa_{1-x}As$, $In_xGa_{1-x}AsN$, $In_xGa_{1-x}AsSb$, $In_xGa_{1-x}AsNSb$, $In_xN$, $In_xGa_{1-x}N$, and $In_xGa_zAl_{1-x-z}N$, where $0<x<1$, and $0<z<1$.

8. The multiwavelength quantum dot laser element as claimed in claim 1, wherein the covering layers are formed from a semiconductor material.

9. The multiwavelength quantum dot laser element as claimed in claim 8, wherein the semiconductor material is selected from a material group consisting of $In_yGa_{1-y}As$, $In_yGa_{1-y}N$, and $In_yGa_zAl_{1-y-z}N$, where $0<y<1$, and $0<z<1$.

10. The multiwavelength quantum dot laser element as claimed in claim 1, wherein each of the quantum dot active regions further comprises a spacing layer, and each of the quantum dot layers is sandwiched between one of the spacing layers and one of the covering layers to constitute a periodic structural unit.

11. The multiwavelength quantum dot laser element as claimed in claim 10, wherein the spacing layers are formed from a semiconductor material.

12. The multiwavelength quantum dot laser element as claimed in claim 11, wherein the semiconductor material is selected from the group consisting of GaAs and GaN material.

13. The multiwavelength quantum dot laser element as claimed in claim 1, further comprising a first electrode adjacent to the first semiconductor layer, and a second electrode adjacent to the second semiconductor layer.

14. A multiwavelength quantum dot laser element, comprising:
    a first semiconductor layer;
    a second semiconductor layer; and
    an active region, disposed between the first semiconductor layer and the second semiconductor layer, having a plurality of quantum dot active regions, each of the quantum dot active regions comprising a quantum dot layer and a covering layer that covers the quantum dot layer,
    wherein when an applied current is larger than a start-oscillation current, the quantum dot active regions simultaneously generate a plurality of laser lights with different wavelengths, and
    wherein each of the quantum dot active regions further comprises a spacing layer, and each of the quantum dot layers is sandwiched between one of the spacing layers and one of the covering layers to constitute a periodic structural unit.

* * * * *